United States Patent

Susak

[11] Patent Number: 5,548,233
[45] Date of Patent: Aug. 20, 1996

[54] CIRCUIT AND METHOD OF BIASING A DRIVE TRANSISTOR TO A DATA BUS

[75] Inventor: David M. Susak, Phoenix, Ariz.

[73] Assignee: Motorola, Inc., Schaumburg, Ill.

[21] Appl. No.: 395,338

[22] Filed: Feb. 28, 1995

[51] Int. Cl.$^6$ ..................................... H03K 5/22
[52] U.S. Cl. ..................... 327/66; 327/539; 323/315
[58] Field of Search ............................. 327/66, 108, 109, 327/110, 111, 112, 374, 375, 376, 377, 530, 538, 540, 432, 434, 436, 437, 483, 575; 330/288; 323/315

[56] References Cited

U.S. PATENT DOCUMENTS

| | | | |
|---|---|---|---|
| 3,996,498 | 12/1976 | Schade, Jr. | 323/315 |
| 4,081,695 | 3/1978 | Allen et al. | 326/56 |
| 4,350,904 | 9/1982 | Cordell | 323/315 |
| 4,553,044 | 11/1985 | Bittner | 327/109 |
| 4,577,125 | 3/1986 | Allen | 326/91 |
| 4,701,631 | 10/1987 | Chieli | 327/482 |
| 4,766,367 | 8/1988 | Saller et al. | 323/315 |
| 4,906,863 | 3/1990 | Van Tran | 327/539 |
| 5,012,128 | 4/1991 | Chan | 327/112 |

*Primary Examiner*—Timothy P. Callahan
*Assistant Examiner*—Kenneth B. Wells
*Attorney, Agent, or Firm*—Robert D. Atkins

[57] ABSTRACT

A data transmitter (12) on a data bus (16) keeps its drive transistor (36) at a minimum bias according to the minimum voltage level on the data bus. The current flowing through the drive transistor in response to a data signal, or a proportional current, is mirrored (52, 54) and compared to a current source (60). Any mismatched between the mirrored current and the current source enables a transistor (58) to bias the drive transistor so that it maintains a minimum conduction state. The base of the drive transistor is held one $V_{be}$ above the minimum voltage on the data bus. The minimum bias on the base of the drive transistor keeps it conducting so that the transition to full conduction is smooth and prevents any sharp transitions that may cause undesired radiated emissions.

16 Claims, 2 Drawing Sheets

5,548,233

CIRCUIT AND METHOD OF BIASING A DRIVE TRANSISTOR TO A DATA BUS

BACKGROUND OF THE INVENTION

The present invention relates in general to data communications and, more particularly, to a circuit and method of biasing a drive transistor to a data bus.

A data bus may comprise one or more electrical conductors that allow communications between a first transmitting and receiving unit (transceiver) and a second transceiver. In automotive applications, the data bus is typically a single conductor that serially transfers commands and status information regarding the vehicle's operation. Many of the automobile functions that were previously controlled with dedicated hard-wire connections are now digitally encoded in one transceiver and transferred over the data bus to another transceiver. For example, when the driver steps on the brake pedal, a control transceiver senses the action and sends a "brake light illuminate" command as a serial 8-bit instruction along the single conductor to the rear of the vehicle where another transceiver receives the serial 8-bit instruction and turns on the brake lights.

In another example, automobiles with air bags have a detonation device, commonly called a squib, that inflates the air bag upon sensing a collision. It is important for the occupant's safety, and the auto manufacturer's liability, that the squib fire at the appropriate time. Hence, the squib is regularly monitored to check its operational status. A control transceiver sends a status request over the data bus to the squib IC transceiver. The squib IC performs the status check and returns the status information back over the data bus to the requesting control transceiver that illuminates a warning light should the squib fail status check.

Thus, the automobile has multiple transceivers that take control of the data bus when it is free to transmit information. There are also multiple transceivers that read from the data bus. The transmission of data must meet industry standard specifications regarding data rate, rise and fall times, and corner transitions of the waveforms. The transceivers are each referenced to chassis ground at the location that it is mounted to the vehicle. Unfortunately, chassis ground can differ by as much as ±2.0 volts around the vehicle. The difference in ground potential may cause one transceiver to hold the data bus at a voltage level higher than expected by another transceiver. The higher voltage on the data bus can cause sharp transitions of the data signal, especially on the corner and rising edge of the waveform, in excess of the industry standards. The sharp transitions and associated high frequency components on a long conductor data bus act as an antenna and cause radiated emissions that can interfere with other electronics in the automobile.

Hence, a need exists to maintain the industry standard data rate and rise and fall times and corners of the transmitted waveforms and avoid radiated emissions.

DETAILED DESCRIPTION OF THE PREFERRED EMBODIMENT

Figure 1:
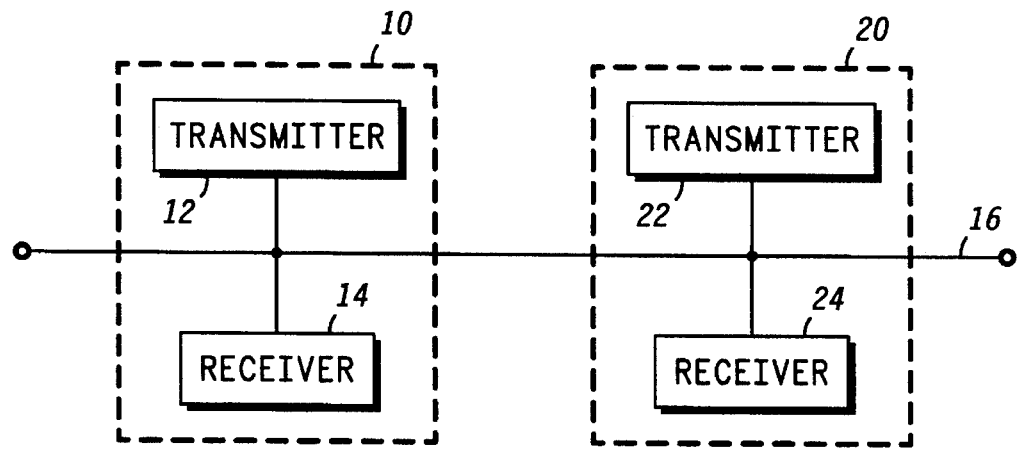
FIG. 1 is a block diagram illustrating transceivers communicating over a single data bus.

Referring to FIG. 1, a data communication system is shown suitable for manufacturing as an integrated circuit using conventional integrated circuit processes. The data communication system may be used in automotive applications. Transceiver 10 includes a transmitter 12 and a receiver 14 each coupled to single conductor data bus 16. Transceiver 20 includes a transmitter 22 and a receiver 24 each coupled to single conductor data bus 16. When data bus 16 is free, transmitter 12 can send serial data over the bus to receiver 24. Likewise, transmitter 22 can send serial data over the bus to receiver 14. For example, transmitter 12 in an automobile central controller can send a status check to receiver 24 that is part of a squib detonation integrated circuit (IC) in an air bag system. The status check instruction is digitally encoded in an 8-bit data word that is transmitted serially. The squib IC performs the status check and responds by way of transmitter 22 with an 8-bit word over data bus 16 back to receiver 14. The results of the status check can be displayed for the occupants.

Figure 2:
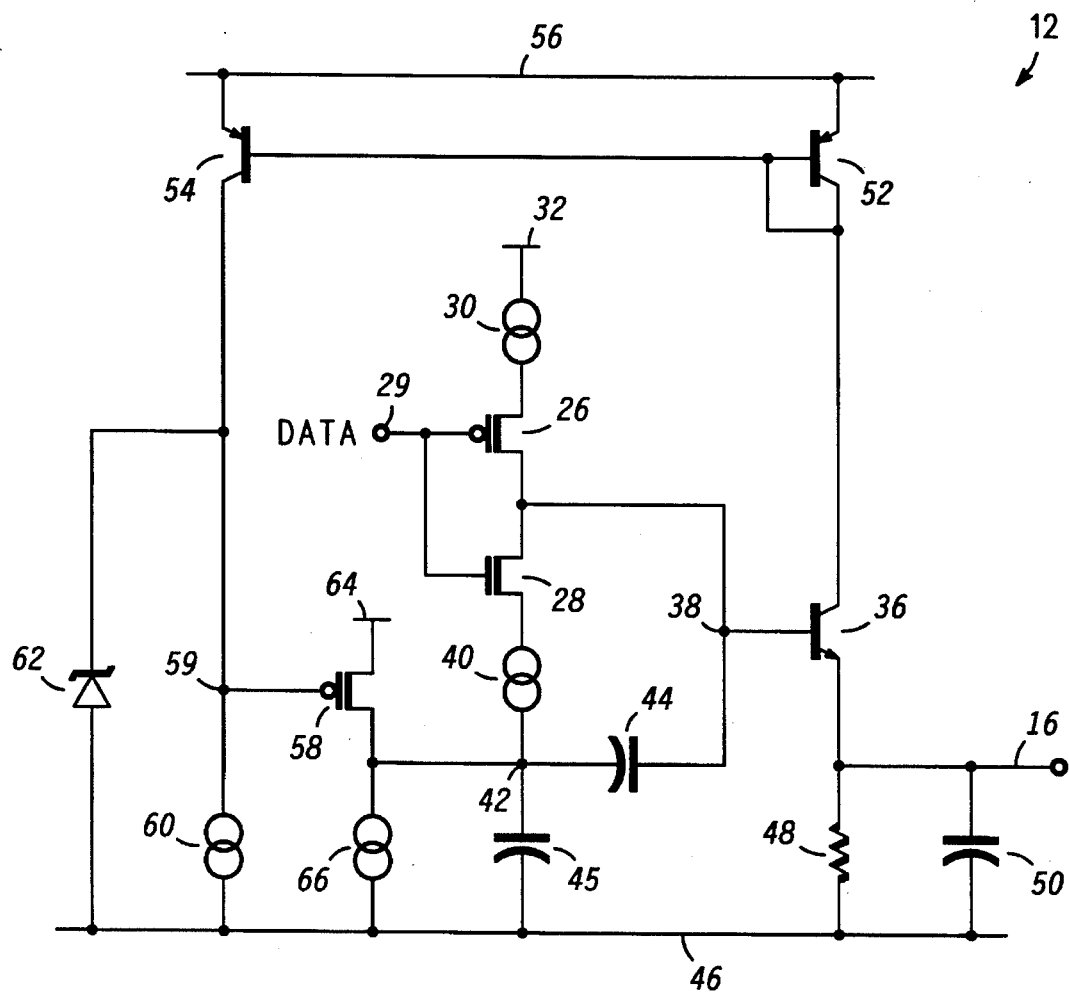
FIG. 2 is a schematic diagram illustrating a transmitter coupled to the data bus.

Further detail of transmitter 12 is shown in FIG. 2 with the gates of transistors 26 and 28 receiving a DATA signal at terminal 29. The source of transistor 26 receives a 5.0 microamps (µa) current from current source 30 that is referenced to power supply conductor 32 operating at 8.0 volts. The drains of transistors 26 and 28 are coupled together to the base of drive transistor 36 at node 38 The source of transistor 28 receives a 5.0 µa current from current source 40 that is referenced to the voltage at node 42. Transistors 26 and 28 and current sources 30 and 40 operate as a turn-on and turn-off circuit for drive transistor 36. A capacitor 44 is selected at 10.0 picofarads (pf) and coupled between node 38 and node 42. A capacitor 45 is selected at 0.1 microfarads (µf) and coupled between node 42 and power supply conductor 46 operating at a chassis ground potential of 0.0 volts. Capacitor 45 is typically external to the transceiver IC.

The emitter of transistor 36 drives data bus 16. Resistor 48 and capacitor 50 are coupled in parallel between data bus 16 and power supply conductor 46. Resistor 48 and capacitor 50 are normally coupled external to the transceiver IC. The collector of transistor 36 is coupled to the collector and base of transistor 52 and to the base of transistor 54. The emitters of transistors 52 and 54 are coupled to power supply conductor 56 operating at 12.0 volts from the automotive battery supply. Transistors 52 and 54 mirror the current flowing through drive transistor 36 for providing a mirrored current from transistor 54. The collector of transistor 54 is coupled to the output of current source 60 and to the gate of transistor 58 at node 59. Current source 60 sinks a 30.0 µa reference current from node 59 to power supply conductor 46. Zener diode 62 maintains an upper voltage limit of 5.0 volts at node 59. The source of transistor 58 is coupled to power supply conductor 64 operating at 5.0 volts. The drain of transistor 58 is coupled to node 42. Current source 66 sinks a 30.0 µa current from node 42 to power supply conductor 46.

Transceivers 10 and 20 are referenced to chassis ground at each mounting location. As shown in FIG. 1, transmitters 12 and 22 are both coupled to data bus 16. Transmitter 12 is referenced to a chassis ground potential of 0.0 volts, while transmitter 22 may be referenced to a different chassis ground potential of say 2.0 volts. Thus, transmitter 22 holds data bus 16 to a minimum of 2.0 volts. It is important that drive transistor 36 transition smoothly from an off-state to an on-state. Otherwise, a sudden conduction through drive transistor 36 can cause a sharp transition in the waveform on the data bus in excess of industry standards.

For example, absent the present invention, if the base of the drive transistor starts below the minimum voltage on the data bus, i.e. base-emitter junction of the drive transistor reverse biased, then the base voltage of the drive transistor increases according to the filtering action of the turn-on circuit. The time constant of the turn-on circuit is much larger than the time constant of the data bus. When the base of the drive transistor reaches one $V_{be}$ above the minimum voltage on the data bus, the drive transistor turns on abruptly and causes a sharp transition on the data bus. The sharp transition has associated high frequency components that induce radiated emissions from the long data bus routed around the automobile.

As part of the present invention, the drive transistors in transmitters 12 and 22 are biased such that the highest ground potential becomes the effective ground potential for each transceiver in the automobile. That is, the drive transistors remain in a minimum conducting state even when the DATA signal is in a "turn-off" state. When the drive transistor receives a "turn-on" signal, it begins from its minimum conducting state and increases smoothly from there to a full-conduction state.

A more detailed discussion of the operation of transmitter 12 proceeds as follows. A logic zero DATA signal turns on transistor 26 and sources current into node 38. Transistor 28 is non-conductive. Transistor 36 conducts about 20.0 milliamps (ma) in full conduction in response to the DATA signal and drives data bus 16 to a logic one (7.0 volts). Resistor 48 and capacitor 50 receive the charging current and set the rise and fall time of the waveform on data bus 16 according to industry standards. For example, the rise and fall times on data bus 16 should be approximately 0.3 volts/μs. The 20.0 ma from transistor 36 also flows through transistor 52 where the current mirror arrangement of transistors 52 and 54 causes transistor 54 to conduct 20.0 ma which is greater than current source 60. Zener diode 62 sinks the excess current from transistor 54 and holds node 59 at 5.0 volts. Transistor 58 does not conduct, and current source 66 slowly discharges node 42.

When the DATA signal goes to logic one, transistor 26 shuts off and transistor 28 turns on to sink current from node 38 through current source 40. The voltage at node 38 falls and transistor 36 reduces its current conduction. The current mirror transistors 52 and 54 also reduce in conduction. As node 38 falls below the base-emitter junction potential ($V_{be}$) of transistor 36 plus the 2.0 volts on data bus 16, transistor 36 begins to turn off. When the mirrored current from transistor 54 goes below the 30 μa reference current sunk by current source 60, the voltage at node 59 begins to fall. That is, the mirrored current is compared to current source 60 and any mismatch less than the 30 μa reference current causes current source 60 to pull down on the gate of transistor 58. Transistor 58 conducts and charges node 42. The voltage at node 38 increases for more conduction through transistor 36. Transmitter 12 settles to a balanced condition where the mirrored current from transistor 54 substantially matches current source 60, less negligible drive to transistor 58. The voltage at node 38 is held one $V_{be}$ above the minimum voltage on data bus 16 to keep transistor 36 conducting in a minimum state.

In summary, when the DATA signal is a logic one "turn-off" state, transistor 36 continuously conducts at least a minimum amount of current. The feedback through current mirror 52, 54 turns on transistor 58 to bias the base of drive transistor 36 to one $V_{be}$ above the minimum voltage on data bus 16. Drive transistor 36 is biased to maintain it conducting so that the mirrored current from transistor 54 substantially matches current source 60. The minimum bias on the base of transistor 36 keeps it conducting in a minimum state so that when transistor 26 begins to charge node 38 in the transmitter turn-on mode, transistor 36 smoothly transitions to full conduction according to the industry standards.

Figure 3:
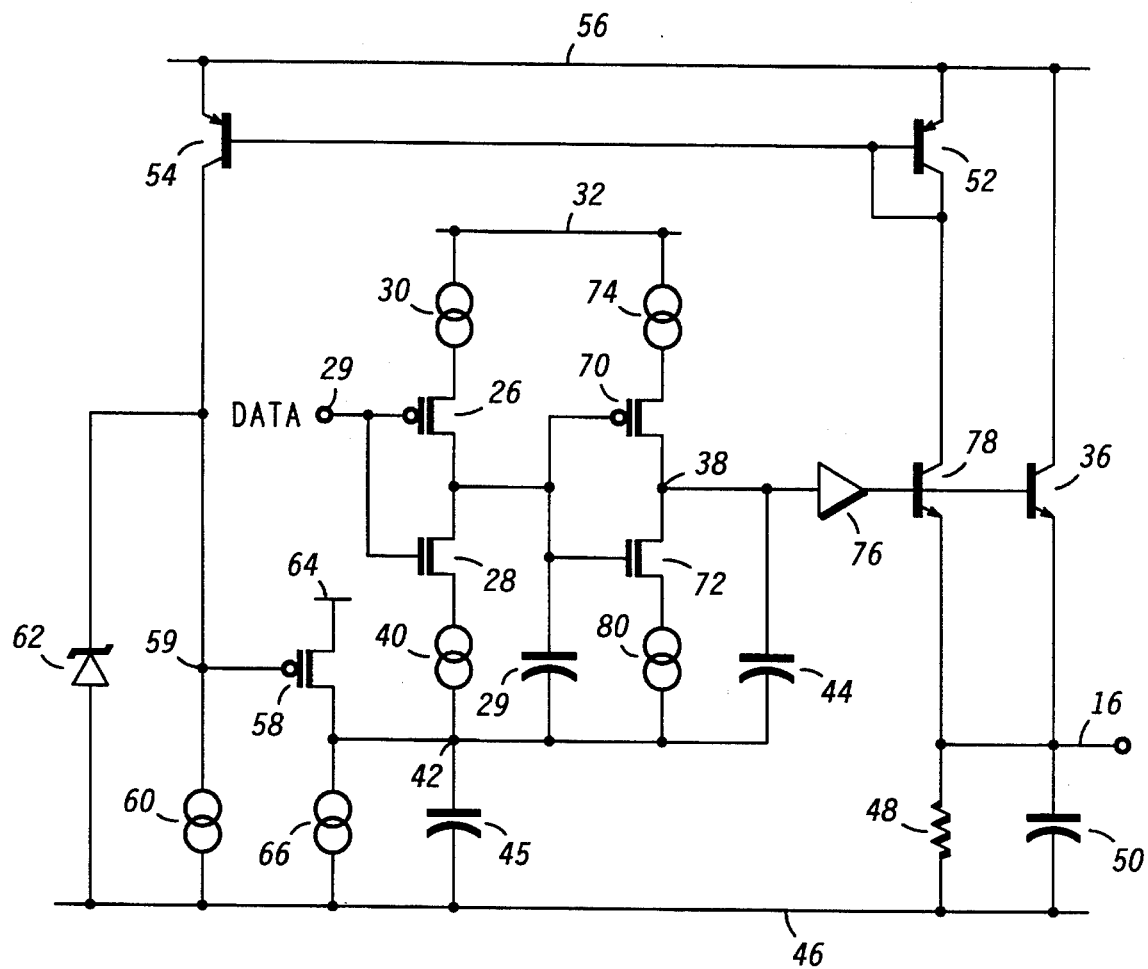
FIG. 3 is a schematic diagram of an alternate embodiment of the transmitter coupled to the data bus.

An alternate embodiment of transmitter 12 is shown in FIG. 3. Components having a similar function are assigned the same reference numbers used in FIG. 2. Transistors 26 and 28 control the slew rate of the waveform on data bus 16. A capacitor 29 is selected at 10.0 pf and coupled between the common drains of transistors 26 and 28 and node 42. The gates of transistors 70 and 72 are also coupled to the common drains of transistors 26 and 28. The source of transistor 70 receives a 5.0 μa current from current source 74 that is referenced to power supply conductor 32. The drains of transistors 70 and 72 are coupled together to an input of buffer 76 at node 38. The output of buffer 76 is coupled to the bases of drive transistor 36 and current feedback transistor 78. The source of transistor 72 receives a 5.0 μa current from current source 80 that is referenced to the voltage at node 42. Transistors 70 and 72 round off the corners of the waveform transitions on data bus 16. The collector of transistor 78 is coupled to the collector of transistor 52. Transistor 78 is sized to conduct a fraction (one-fifth) of the drive current through transistor 36 whereby current mirror transistors 52, 54 feedback a smaller portion of the total drive current to data bus 16. Alternately, transistors 36 and 78 may be combined into a multiple collector transistor where a first collector is coupled to power supply conductor 56 and conducts the main drive current to data bus 16 while a second collector from the drive transistor is coupled to transistor 52 to provide the proportional feedback current.

The operation of the alternate embodiment of transmitter 12 proceeds as follows. A logic one DATA signal turns on transistor 28 to discharge capacitor 29 at a predetermined slew rate (0.3 volts/μs) which gradually turns on transistor 70 and sources current from current source 74 through buffer 76 to transistors 78 and 36. Transistors 26 and 72 are non-conductive. Transistor 36 conducts about 20.0 ma in full conduction in response to the DATA signal and drives data bus 16 to a logic one. Transistor 78 is sized to conduct about 4.0 ma which is about one-fifth of the total drive current through transistor 36. The feedback current flows through transistor 52 where the current mirror arrangement causes transistor 54 to conduct 4.0 ma which is greater than current source 60. Zener diode 62 sinks the excess current from transistor 54 and holds node 59 at 5.0 volts. Transistor 58 does not conduct, and current source 66 slowly discharges node 42.

When the DATA signal goes to logic zero, transistor 28 shuts off and transistor 26 turns on to charge capacitor 29 at a predetermined slew rate (0.3 volts/μs) which gradually turns on transistor 72 and sinks current from node 38 into current source 80. The voltage at node 38 falls and transistors 36 and 78 both reduce in current conduction. The current mirror transistors 52 and 54 also reduce in conduction. As node 38 falls below the $V_{be}$ of transistor 78 plus the 2.0 volts on data bus 16, transistor 78 begins to turn off. When the mirrored current from transistor 54 goes below the 30 μa reference current sunk by current source 60, the voltage at node 59 begins to fall. That is, the mirrored current is compared to current source 60 and any mismatch less than the 30 µa reference current causes current source 60 to pull down on the gate of transistor 58. Transistor 58 conducts and charges node 42. The voltage at node 38 increases for more conduction through transistors 36 and 78. Transmitter 12 settles to a balanced condition where the mirrored current from transistor 54 substantially matches current source 60, less negligible drive to transistor 58. The voltage at node 38 is held one $V_{be}$ above the minimum voltage on data bus 16 to keep transistors 36 and 78 conducting in a minimum state.

In summary, when the DATA signal is a logic zero "turn-off" state, transistors 36 and 78 continuously conduct at least a minimum amount of current. Transistor 78 feeds back a fraction of the total drive current through current mirror 52, 54 which turns on transistor 58 to bias the bases of transistors 36 and 78 to one $V_{be}$ above the minimum voltage on data bus 16. Transistors 36 and 78 are biased to maintain each conducting so that the mirrored current from transistor 54 matches current source 60. The minimum bias on the base of transistor 36 keeps it conducting in a minimum state so that when transistors 28 and 70 begin to charge node 38 in the transmitter turn-on mode, transistor 36 smoothly transitions to full conduction according to the industry standards.

By now it should be appreciated that the present invention provides a minimum bias to the base of the drive transistor according to the minimum voltage level on the data bus. The current flowing through the drive transistor in response to a data signal, or a proportional current, is mirrored and compared to a current source. Any mismatched between the mirrored current and the current source enables a transistor to bias the drive transistor so that it maintains a minimum conduction state. The base of the drive transistor is held one $V_{be}$ above the minimum voltage on the data base. The minimum bias on the base of the drive transistor keeps it conducting so that when the turn-on circuit begins to charge the base of the drive transistor, it smoothly transitions to full conduction according to the industry standards and prevents any sharp transitions that may cause undesired radiated emissions.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An integrated data communication circuit, comprising:
   a drive transistor having an emitter coupled to a data bus, and a base coupled to a first node;
   a current mirror having an input coupled to a collector of said drive transistor;
   a first current source coupled to an output of said current mirror at a second node;
   a first transistor having a gate coupled to said second node, a source coupled to a first power supply conductor, and a drain coupled to said first node for maintaining a minimum bias level of said drive transistor;
   a second transistor having a gate coupled for receiving a data signal, and a drain coupled to said first node; and
   a second current source coupled between a second power supply conductor and a source of said second transistor.

2. The data communication circuit of claim 1 further including:
   a third transistor having a gate coupled for receiving said data signal, and a drain coupled to said first node; and
   a third current source coupled between a source of said third transistor and a third node at said drain of said first transistor.

3. The data communication circuit of claim 2 further including:
   a first capacitor coupled between said first node and said third node;
   a second capacitor coupled between said third node and a third power supply conductor; and
   a fourth current source coupled between said third power supply conductor and said third node.

4. The data communication circuit of claim 3 further including:
   a zener diode coupled between said second node and said third power supply conductor;
   a first resistor coupled between said data bus and said third power supply conductor; and
   a third capacitor coupled between said data bus and said third power supply conductor.

5. The data communication circuit of claim 2 wherein said current mirror includes:
   a fourth transistor having a base and a collector coupled together to said collector of said drive transistor, and an emitter coupled to a third power supply conductor; and
   a fifth transistor having a base coupled to said base and collector of said second transistor, an emitter coupled to said third power supply conductor, and a collector coupled to said second node.

6. A method of biasing a drive transistor to a data bus in an integrated circuit, comprising the steps of:
   conducting a feedback current proportional to current conduction through the drive transistor where said feedback current flows in response to a data signal;
   mirroring said feedback current for providing a mirrored current;
   comparing said mirrored current to a first current source; and
   biasing the drive transistor to maintain a minimum conduction state where said mirrored current matches said first current source.

7. The method of claim 6 wherein said biasing step includes the step of enabling a first transistor to source current to a base of the drive transistor upon detecting a mismatch between said mirrored current and said first current source.

8. The method of claim 7 further including the steps of:
   charging said base of the drive transistor in response to a first state of said data signal; and
   discharging said base of the drive transistor in response to a second state of said data signal.

9. An integrated data communication circuit, comprising:
   a drive transistor having an emitter coupled to a data bus, a base coupled to a first node, and a collector couple to a first power supply conductor;
   a first transistor having an emitter coupled to said data bus, and a base coupled to said first node;
   a current mirror having an input couple to a collector of said first transistor;
   a first current source coupled to an output of said current mirror at a second node;
   a second transistor having a gate coupled to said second node, a source coupled to a second power supply conductor, and a drain coupled to said first node for maintaining a minimum bias level of said drive transistor;

a third transistor having a gate coupled for receiving a data signal; and a second current source coupled between a third power supply conductor and a source of said third transistor.

10. The data communication circuit of claim 9 further including:

a fourth transistor having a gate coupled for receiving said data signal, and a drain coupled to a drain of said third transistor; and a third current source coupled between a source of said fourth transistor and a third node at said drain of said second transistor.

11. The data communication circuit of claim 10 further including:

a fifth transistor having a gate coupled to said drains of said third and fourth transistors; and a fourth current source coupled between said third power supply conductor and a source of said fifth transistor.

12. The data communication circuit of claim 11 further including:

a sixth transistor having a gate coupled to said drains of said third and fourth transistors, and a drain coupled to a drain of said fifth transistor; and a fifth current source coupled between said third node and a source of said sixth transistor.

13. The data communication circuit of claim 12 further including a buffer circuit having an input coupled to said first node and having an output coupled to said bases of said drive transistor and said first transistor.

14. The data communication circuit of claim 13 further including:

a first capacitor coupled between said first node and said third node;

a second capacitor coupled between said third node and a fourth power supply conductor; and a sixth current source coupled between said fourth power supply conductor and said third node.

15. The data communication circuit of claim 14 further including:

a zener diode coupled between said second node and said fourth power supply conductor;

a first resistor coupled between said data bus and said fourth power supply conductor; and a third capacitor coupled between said data bus and said fourth power supply conductor.

16. The data communication circuit of claim 10 wherein said current mirror includes:

a fifth transistor having a base and a collector coupled together to said collector of said first transistor, and an emitter coupled to said first power supply conductor; and a sixth transistor having a base coupled to said base and collector of said second transistor, an emitter coupled to said first power supply conductor, and a collector coupled to said second node.

* * * * *

UNITED STATES PATENT AND TRADEMARK OFFICE
CERTIFICATE OF CORRECTION

PATENT NO. : 5,548,233
DATED : August 20, 1996
INVENTOR(S) : David M. Susak

It is certified that error appears in the above-indentified patent and that said Letters Patent is hereby corrected as shown below:

In claim 9, column 6, line 53, delete "couple" and insert --coupled--.

In claim 9, column 6, line 57, delete "couple" and insert --coupled--.

Signed and Sealed this

Fifteenth Day of April, 1997

Attest:

BRUCE LEHMAN

*Attesting Officer*      *Commissioner of Patents and Trademarks*